(12) United States Patent
Green et al.

(10) Patent No.: US 10,878,742 B2
(45) Date of Patent: Dec. 29, 2020

(54) PROTECTIVE COVER FOR DIRECT VIEW LIGHT EMITTING DIODE DISPLAYS

(71) Applicant: PLANAR SYSTEMS, INC., Beaverton, OR (US)

(72) Inventors: Patrick J. Green, Beaverton, OR (US); Todd E. Loewy, Seattle, WA (US); Jennifer Davis, Dunwoody, GA (US); Samantha Phenix, Beaverton, OR (US); Eric Schuettke, Beaverton, OR (US)

(73) Assignee: Planar Systems, Inc., Beaverton, OR (US)

( * ) Notice: Subject to any disclaimer, the term of this patent is extended or adjusted under 35 U.S.C. 154(b) by 220 days.

(21) Appl. No.: 16/081,938

(22) PCT Filed: Jan. 23, 2018

(86) PCT No.: PCT/US2018/014925
§ 371 (c)(1),
(2) Date: Sep. 3, 2018

(87) PCT Pub. No.: WO2018/140417
PCT Pub. Date: Aug. 2, 2018

(65) Prior Publication Data
US 2019/0108785 A1    Apr. 11, 2019

Related U.S. Application Data

(60) Provisional application No. 62/449,944, filed on Jan. 24, 2017.

(51) Int. Cl.
*G09G 3/32* (2016.01)
*H01L 25/075* (2006.01)
(Continued)

(52) U.S. Cl.
CPC ............... *G09G 3/32* (2013.01); *F21K 9/20* (2016.08); *G09F 9/3026* (2013.01);
(Continued)

(58) Field of Classification Search
CPC ....... G09G 3/32; G09G 3/3433; G09F 9/3026
(Continued)

(56) References Cited

U.S. PATENT DOCUMENTS 6,940,418 B2    9/2005    Blum et al.
9,538,588 B2    1/2017    Mutschelknaus et al.
(Continued)

FOREIGN PATENT DOCUMENTS

KR    20120115868 A    10/2012
KR    101458791 B1    11/2014

*Primary Examiner* — Kevin K Pyo
(74) *Attorney, Agent, or Firm* — Stoel Rives LLP

(57) ABSTRACT

A direct view light emitting diode (DV LED) display (296), includes (i) one or more DV LED modules (200) each containing at least one circuit board (300) having an array of surface mount device LEDs (100) defining a display surface (304), and (ii) a protective transparent polymeric film (302, 390) covering at least a portion of the display surface. The transparent polymeric film includes a polymer material layer (400), and an adhesive layer (402) laminated to the polymer material layer and directly attached to the display surface of the DV LED module. The transparent polymeric film may facilitate the use of touch screen technology with a DV LED display, and may be removable to allow repair or disassembly/reassembly of the DV LED display.

21 Claims, 5 Drawing Sheets

(51) Int. Cl.
*F21K 9/20* (2016.01)
*G09F 9/302* (2006.01)
*G09G 3/34* (2006.01)
*H01L 33/44* (2010.01)

(52) U.S. Cl.
CPC ....... *G09G 3/3433* (2013.01); *H01L 25/0753* (2013.01); *H01L 33/44* (2013.01)

(58) Field of Classification Search
USPC .......................................... 250/216; 313/505
See application file for complete search history.

(56) References Cited

U.S. PATENT DOCUMENTS

| | | |
|---|---|---|
| 10,600,354 B2 * | 3/2020 | Deeman ................ H05K 3/303 |
| 2004/0100796 A1 | 5/2004 | Ward |
| 2009/0251040 A1 | 10/2009 | Kim |
| 2010/0084665 A1 | 4/2010 | Daniels et al. |
| 2015/0109283 A1 | 4/2015 | Gates et al. |

* cited by examiner

PROTECTIVE COVER FOR DIRECT VIEW LIGHT EMITTING DIODE DISPLAYS

RELATED APPLICATIONS

This application claims the priority benefit of U.S. Provisional Patent Application No. 62/449,944, filed Jan. 24, 2017, which is incorporated herein by reference.

TECHNICAL FIELD

The field of the present disclosure relates to direct view (DV) light emitting diode (LED) displays and, more particularly, to a DV LED display with a removable film cover adhered to the LEDs of the DV LED display.

BACKGROUND

Fine pitch DV LED displays are an emerging indoor video wall technology in applications where close customer proximity is common. In particular, there is a growing demand for implementation of touch input to DV LED display video walls.

Unlike other video wall technologies where the front display surface of the video wall is composed of a contiguous array of glass or plastic sheets, such as tiled active-matrix liquid crystal displays (AMLCDs) or tiled rear projection cubes, respectively, the surface of a DV LED display is an array of DV LED modules, each module having an array of discrete LEDs mounted directly to a printed circuit board (PCB) substrate. A DV LED module may consist of four PCBs, for example. A DV LED video wall display comprises an array of DV LED modules or display panels connected and mounted together to achieve a desired video wall size.

DV LED modules are susceptible to damage from human contact involving abrasion, impacts, and exposure to liquids, particularly if the LEDs are mounted directly to the outer face of the PCBs as surface mount devices (SMDs). DV LED displays made by a chip-on-board (COB) technique may also be susceptible to damage from human contact. Exposure to a spilled liquid or other substances can be catastrophic since there is no way to introduce a cleaning fluid without potentially creating further damage to the PCBs and their sensitive electronics. The space between adjacent SMD LEDs on the printed circuit boards also tends to collect dust and debris, including, in touch screen applications, skin dander and oils. Such contamination is difficult to remove or control. Further, for touch screen applications, DV LED video walls present a rough surface that is not ideal for touch input where a smooth tactile experience is desired.

Occasionally the discrete LEDs or the PCBs require field repair or replacement, and the present inventors have recognized that access to individual modules of the video wall may be desirable or necessary, as taught, for example, by U.S. Patent Application Publication No. US 2016/0210886 of Brashnyk et al., which is incorporated herein by reference. DV LED displays may also need to be disassembled into constituent DV LED modules and then reassembled, for example when moving them from one location to another.

Glass substrates have been considered for covering the front of the display to protect delicate SMD LED components, but glass is very heavy (e.g., greater than 100 pounds (45 kg) is typical for a 108-inch diagonal (274 cm) DV LED display glass), awkward, and potentially dangerous for installation and removal for repair of a DV LED video wall. DV LED modules can be tiled to almost any desired size, while glass having suitable characteristics for covering the DV LED video wall is rarely available larger than approximately 108 inches (274 cm) diagonal. Further, glass coverings tend to degrade optical performance. Cover glass may have a thickness of 0.25 inches (6.4 mm) or more, which may cause parallax confusion for touch input. In addition, cover glass may need to be mounted spaced some distance from the DV LED array for thermal considerations, further worsening the parallax issue.

Large rigid transparent sheets of acrylic (PMMA or plexi-glass) or polycarbonate have also been considered to cover an array of LED modules but these materials are soft (prone to scratching), very expensive, and also have size limitations and parallax confusion issues similar to glass.

The present inventors have recognized a need for addressing the above-discussed issues without compromising the display optics, viewability, or touch input experience.

DETAILED DESCRIPTION OF PREFERRED EMBODIMENTS

This section describes particular embodiments and their detailed construction and operation. The embodiments described herein are set forth by way of illustration only and not limitation. Throughout the specification, references to "one embodiment," "an embodiment," and "some embodiments" are not necessarily referring to the same embodiment. The described features, structures, characteristics, and methods of operation may be practiced in isolation or combined in any suitable manner, and can be practiced without one or more of the specific details or with other methods, components, materials, or the like. In other instances, well-known structures, materials, or methods of operation are not shown or not described in detail to avoid obscuring more pertinent aspects of the embodiments.

The embodiments described herein are presented in the context of an SMD-type DV LED display device, by way of example. Similar embodiments may also be employed with a COB-type DV LED display device, other types of DV LED devices, and potentially other types of display devices.

Figure 1:
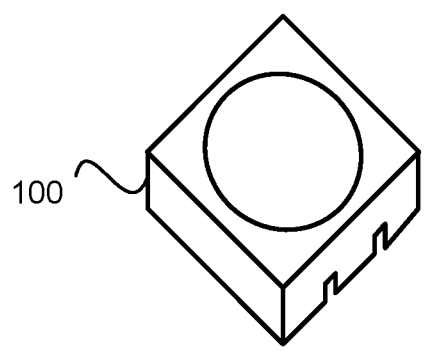
FIG. 1 illustrates a discrete SMD LED.
Figure 2:
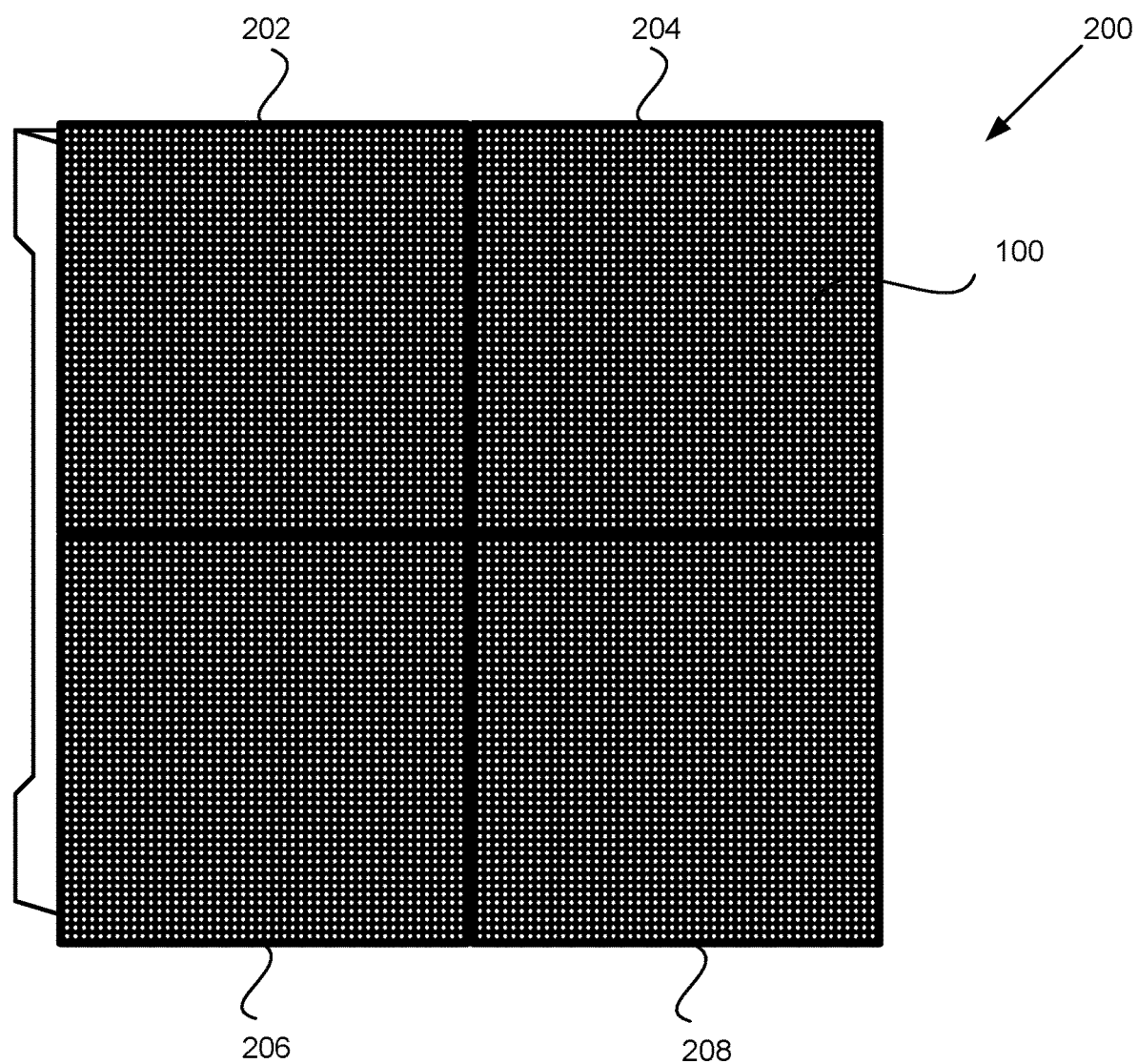
FIG. 2 illustrates a DV LED display with a plurality of circuit boards, each circuit board including an array of the SMD LEDs of FIG. 1.

FIG. 1 illustrates a discrete SMD LED device 100. SMD LEDs 100 are solder-mounted to the face of printed circuit board (PCB) substrates, as illustrated in FIG. 2, which are used to create a DV LED display. FIG. 2 illustrates a DV LED module 200, also referred to as a display panel, including four circuit boards (e.g., PCBs) 202, 204, 206, and 208. Each circuit board 202-208 includes an array of hundreds of SMD LEDs 100 mounted to an outer face of the circuit board 202, 204, 206, 208. Although FIG. 2 illustrates a DV LED module 200 comprised of four circuit boards 202, 204, 206, 208, any number of desired circuit boards (e.g. one or more) may be used, as would be understood by one of ordinary skill in the art. As mentioned above, a DV LED display comprises one or more DV LED modules 200, such as an array of DV LED modules 200 connected so that an image is displayed spread across all connected DV LED modules 200. The array of connected DV LED modules 200 defines a display surface 304 (FIG. 3) of the DV LED display. The DV LED display may be any display that uses SMD LEDs 100. In some embodiments, a display may include a single DV LED module 200.

Figure 3:
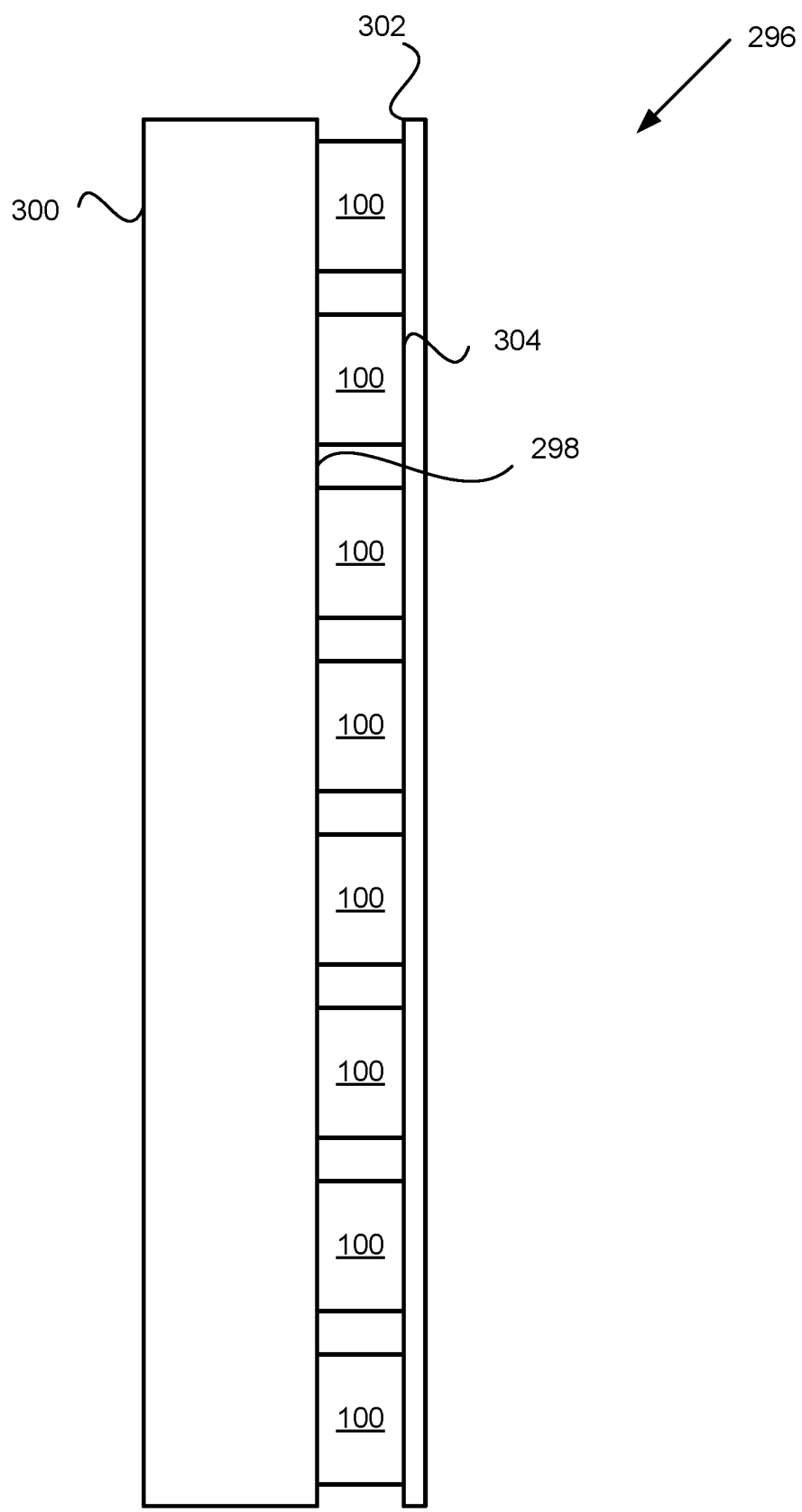
FIG. 3 is a cross-sectional schematic view of a portion of the DV LED display of FIG. 2 with a removable protective film covering the SMD LEDs.

FIG. 3 is an example cross-sectional schematic diagram of a portion of a DV LED display 296, which is typically a video display. As can be seen in FIG. 3, a plurality of SMD LEDs 100 are mounted in an array on an outer surface 298 of a printed circuit board 300 so as to form a display surface 304, which may be discontinuous. Covering the display surface 304 is a film 302. Film 302 is a thin, flexible, and durable transparent polymeric film. Film 302 is adhered or adhesively attached, typically via an adhesive layer backing (illustrated as 402 in FIG. 4), directly to the outer surface of SMD LEDs 100 (i.e., to the display surface 304). The adhesive material of the adhesive layer or other adhesive property of the film may be selected to allow film 302 to be readily removed, as further described below, or may result in a permanent attachment. The film 302 may be pliable and includes an external surface that allows for a desired tactile feel by a user during touch screen applications of the DV LED display 296, as well as protecting the printed circuit boards 300 and SMD LEDs 100 from damage. For example, the outer surface of film 302 may be as smooth as polished glass, or have a light matte finish or a texture that has good optical properties and resists fingerprints.

Figure 4:
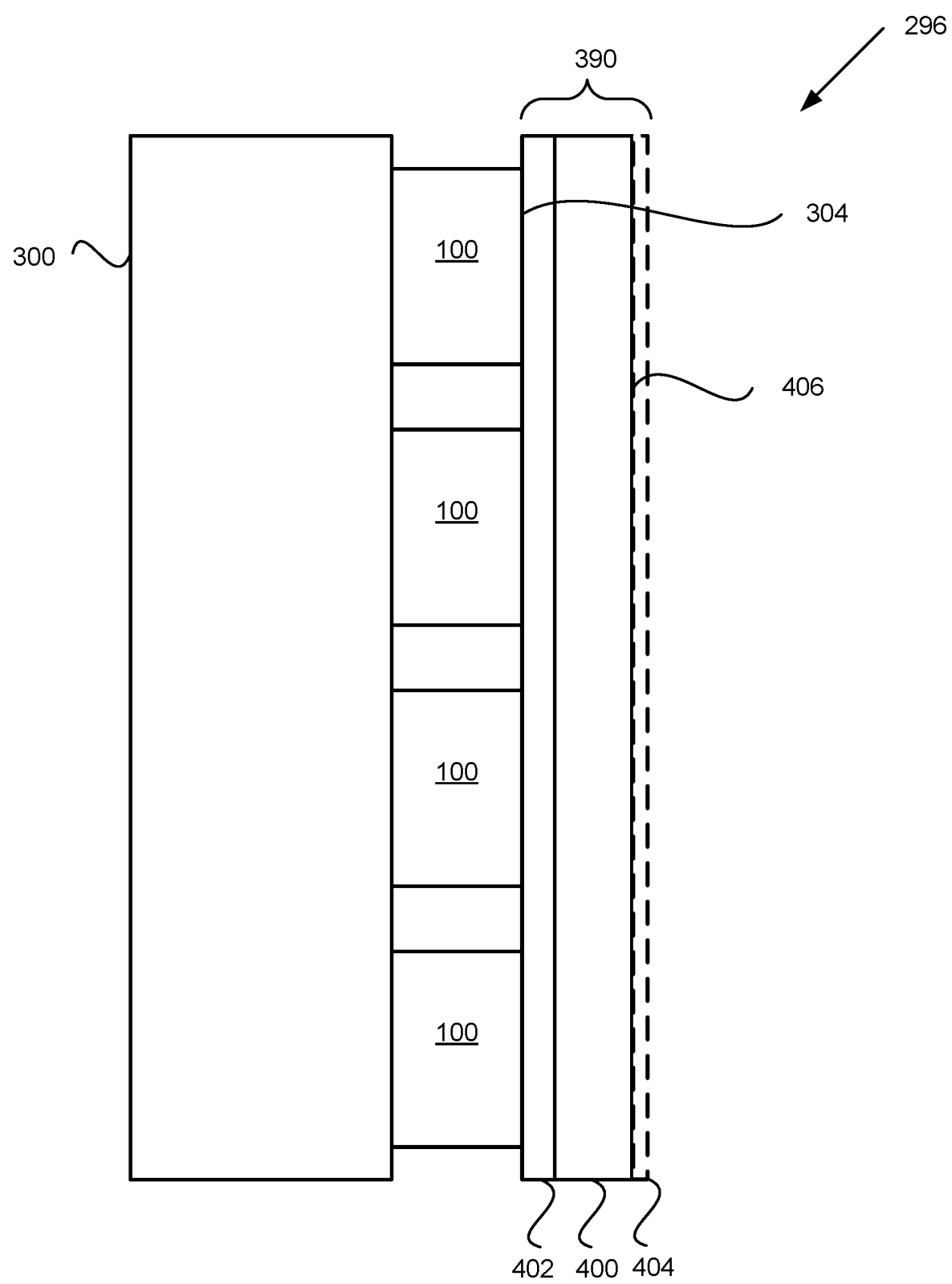
FIG. 4 is a cross-sectional schematic view of a removable protective film on a portion of a DV LED display.

FIG. 4 is a detailed cross-sectional schematic view of a laminate composite film 390 on a portion of the DV LED display 296. Composite film 390 includes a film stock 400 backed by an adhesive layer 402 which attaches composite film 390 directly to display surface 304. In some embodiments, the composite film 390 may also include a secondary layer or surface coating 404 laminated to a front surface 406 of the film stock 400 opposite the adhesive layer 402.

Composite film 390 protects display surface 304 from accumulation of contamination and prevents liquid from coming into contact with the SMD LEDs 100, or with the circuit board 300 between the SMD LEDs 100, and improves the tactile feel of the surface of the DV LED display 296 for touch input applications. In some embodiments, the composite film 390 covers an entirety of the display surface 304 defined by an array of LED modules (see FIG. 2, illustrating one LED module 200) of the DV LED display 296, with one continuous sheet of removable composite film 390 (or film 302). In other embodiments, the composite film 390 only covers a portion of a DV LED display. For example, for a very large video wall display, the composite film 390 may cover only a bottom portion of the video wall display that may be more susceptible to damage or that may be used in a touch application. In some embodiments, the removable composite film 390 for film 302 is 60 inches (152 cm) wide. In other embodiments, multiple sheets of film may be used to cover a display surface of the DV LED display. In other embodiments, each individual DV LED module 200 is covered by a section of film 302 or 390 sized to fit the module 200 and to protect the array of SMD LEDs 100 thereon. In these embodiments, DV LED displays with dimensions greater than the available width of film may be completely protected with multiple sections of film.

With reference to FIG. 4, the film stock 400 is formed of a polymer material selected for its optical clarity and neutral spectral response so that the film imparts no color. In some embodiments, the film stock 400 may be less than optically clear (e.g. translucent), preferably with a neutral spectral response, but because it is optically bonded to the LEDs it may not substantially degrade the image quality of the DV LED display, thus performing as a substantially transparent or optically clear film. The film stock 400 may be photochemically stable with respect to the irradiation from blue LEDs having an emission wavelength of approximately 465 nm, which is capable of imparting discoloration into other polymers. The film stock 400 has a thickness ranging from 0.010 to 0.100 mm, or from 0.050 to 0.100 mm, or from 0.050 to 0.080 mm.

In some embodiments, the film stock 400 is polypropylene film. The film stock 400, however, may be made of other polymer materials having optical clarity and neutral spectral response, such as polycarbonate or polyethylene. However, the film stock 400 may be any polymer material that is optically neutral and does not undergo photo degradation that leads to the loss of optical clarity or a loss of color neutrality.

The adhesive layer 402 may be a pressure sensitive adhesive with sufficient adhesion to provide a long-term bond to the SMD LEDs 100, but preferably not so strong of adhesion that the film 390 cannot be removed without damaging the SMD LEDs 100 or their bond to the circuit board 300. For example, the adhesive should have a higher bond strength to the film stock 400 than to the surface of the SMD LEDs 100. The bond strength should also not be stronger than the bonds between the SMD LEDs and the underlying circuit board 300 or other substrate to which the LEDs are attached. Similar to the film stock 400, the adhesive layer 402 should also be optically neutral and should not undergo any photo degradation that leads to a loss of optical clarity or a loss of color neutrality. The pressure sensitive adhesive may be an acrylic type adhesive. However, any pressure sensitive adhesive may be used if it is optically neutral, does not undergo photo degradation that leads to the loss of optical clarity or a loss of color neutrality, and maintains the proper adhesive characteristic allowing removal but no loss of adhesion.

The adhesive layer 402 preferably allows for the film 390 to be removed from the display surface 304 by peeling the film 390 away without damaging the SMD LEDs 100, detaching the SMD LEDs 100 from the circuit board 300, or leaving an adhesive or a tacky residue on the SMD LEDs 100. This allows for repair of the DV LED display 296 in the field without having to remove glass from the front of the DV LED display 296, which may be heavy or awkward, as mentioned above. After removal, either the film 390 may be re-adhered to the display surface 304, or a new film 390 may be provided to adhere to the display surface 304 of the DV LED display 296. As mentioned above, the adhesive layer 402 is laminated to the film stock 400 and may include a release liner (illustrated in FIG. 5) that protects the adhesive layer 402 until the liner is removed for installation of film 390 on the DV LED display 296 in the field.

In some embodiments, the adhesive layer 402 optically couples to the LEDs, e.g., via a rough embossed surface of the SMD LEDs 100, and thereby enhances the optical performance of the LEDs 100. A resulting outcoupling of light may increase the total light output and improve the radial light distribution from the DV LED display 296.

The surface coating 404 may be a treatment that imparts anti-glare and/or anti-reflective characteristics to the film 390. In some embodiments, the surface coating 404 may include a hard coating that improves durability. The hard coating may be provided by itself on an outer surface of the film 390, or may be layered over or incorporated with other coatings, such as an anti-glare and/or anti-reflective surface coating. The hard coating is preferably scratch-resistant and may have a hardness of greater than 2H pencil, or more preferably greater than 4H or greater than 6H, as measured according to ISO 15184:2012. The surface coating 404 may also include a smudge- and fingerprint-resistant oleophobic coating. In some embodiments, the surface coating 404 may be a surface treatment to reduce or eliminate electrostatic discharge when a user touches a screen during a touch application. Finally, the surface coating 404 may be or also include an antimicrobial material or layer to minimize the transmission of disease during touch screen applications. The surface coating 404 may include any combination of these different types of coatings.

Figure 5:
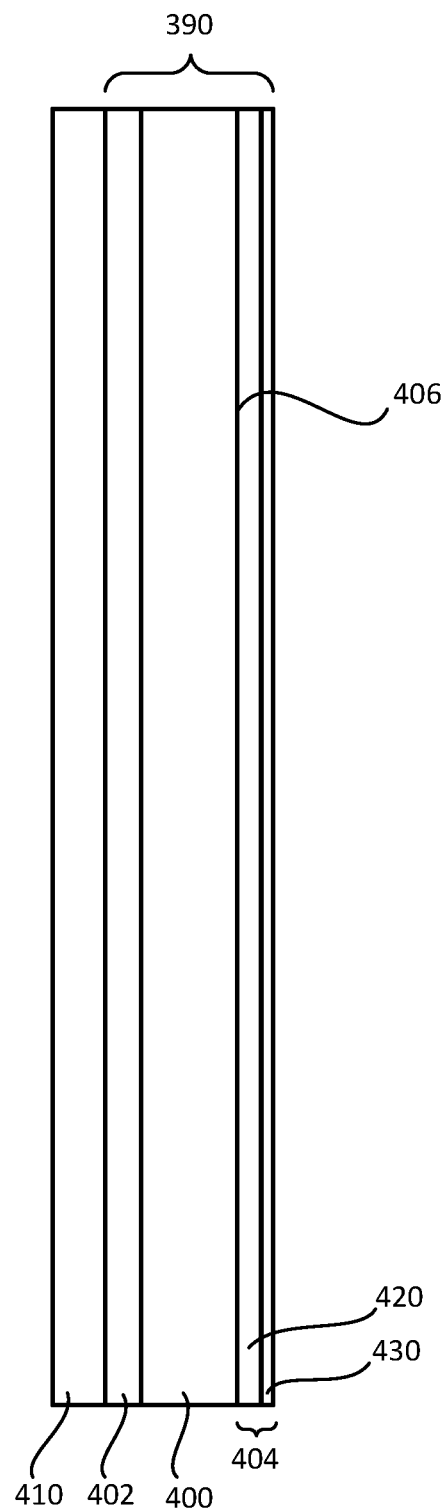
FIG. 5 is a cross-sectional schematic illustration of a removable protective film backed by a release liner and including multiple secondary layers.

Composite film 390 may be provided in sheet form or in the form of a roll, may be applied to the DV LED display in the factory or in the field, and may be sold as an aftermarket item. In any case, the adhesive layer 402 of the composite film 390 may be backed with a release liner 410, as illustrated in FIG. 5. The release liner 410 is provided to facilitate transport and may be peeled away to expose the adhesive layer 402 for installation on DV LED display 296 (FIG. 4). If the composite film 390 is provided in roll form, the release liner 410 may alternatively be omitted. FIG. 5 further illustrates that the surface coating 404 of the composite film 390 may comprise two or more distinct layers, such as a first layer 420 that with anti-reflective and/or anti-glare properties, and an outer coating 430 that may be a hard coating and/or provide fingerprint-resistant properties. In other embodiments, not illustrated, laminated layers or coatings (404, 420, 430) may be applied between the film stock 400 and adhesive layer 402, or on both sides of the film stock 400.

Protective films (e.g., 302 or 390) according to the present disclosure may be used with any of a variety of touch screen technologies, such as infrared (IR), surface acoustic wave (SAW), camera-based, resistive, surface capacitive, and projected capacitive (PCAP), for example. In some embodiments, a touch screen sensor technology such as PCAP may be included in or embedded in the protective film itself, so that applying the protective film to the DV LED display also adds touch screen functionality to the DV LED display while providing protective qualities and improved tactile feel.

In some embodiments, the protective film (e.g., 302 or 390) may include additional components, additives, or materials. For example, the film may include an additive, constituent, or secondary film layer that creates a neutral density filter to enhance contrast. For example, the neutral density filter may be an optical sheet (provided as surface coating 404 or otherwise) that reduces intensity of all wavelengths approximately equally across the visible spectrum with no resultant color change to the transmitted light.

In some embodiments, the film (e.g., 302 or 390) may include a component, additive, or material that is absorbent of wavelengths of light in the regions of the visible spectrum that are not emitted by the LEDs, which may enhance display contrast. For example, if the LEDs emit light in the red, green, and blue parts of the visible spectrum, the component, additive or materials could be selected to absorb light in the complementary parts of the visible spectrum, i.e., yellow, cyan, and magenta.

In some embodiments, the DV LED display may include a protective film (e.g., 302 or 390) with a patterned circular polarizer that enables the viewing of stereoscopic 3D images, such as with the use of proper polarizing glasses and video input. In such a situation, the film is registered to the rows of LEDs of the DV LED display.

In some embodiments, an optical component may be incorporated into the protective film (e.g., 302 or 390) to provide an anti-moiré function, which is beneficial when the DV LED display is used to display video from video cameras or some other pixelated image device.

The various surface coatings 404 discussed above, as well as the additional film components discussed above may be provided in any combination necessary for a desired viewing of a video on a DV LED display.

It will be obvious to those having skill in the art that many changes may be made to the details of the above-described embodiments without departing from the underlying principles of the invention. For example, while embodiments are described in connection with DV LED displays utilizing SMD LEDs, protective films according to the present disclosure may also be similarly utilized with COB-type DV LED displays; with DV LED displays including LEDs mounted to various substrates, including PCBs and others; and with other types of displays in which the benefits of the various possible attributes of the protective film may be beneficial. The scope of the present invention should, therefore, be determined only by the following claims.

The invention claimed is:

1. A direct view light emitting diode (DV LED) display device, comprising:
   at least one DV LED module including a substrate having an array of multiple discrete LEDs mounted on a surface of the substrate; and
   a transparent film covering the at least one DV LED module, the transparent film having an external surface and including:
      a polymer material layer, and
      an adhesive layer laminated to the polymer material layer and adhered to the at least one DV LED module over the array of LEDs, with the external surface of the transparent film facing away from the array of LEDs, wherein the adhesive layer has a bond strength to the LEDs that is less than a bond strength between the LEDs and the substrate, and less than a bond strength between the adhesive layer and the polymer material layer.

2. The DV LED display device of claim 1, including an array of multiple DV LED modules defining a display surface.

3. The DV LED display device of claim 2, wherein the transparent film comprises one continuous sheet that covers multiple DV LED modules of the display surface.

4. The DV LED display device of claim 2, further comprising a plurality of transparent films, and wherein each one of the DV LED modules is covered by one of the films.

5. The DV LED display device of claim 1, wherein:
   the substrate of each DV LED module includes a circuit board on which the array of LEDs is mounted; and
   the array of LEDs is an array of surface mount device (SMD) LEDs.

6. The DV LED display device of claim 5, wherein the adhesive layer is adhered directly to the array of SMD LEDs.

7. The DV LED display device of claim 1, wherein the transparent film further includes an anti-glare and/or anti-reflective layer adjacent to the polymer material layer.

8. The DV LED display device of claim 1, wherein the polymer material layer has a thickness between 0.010 mm and 0.100 mm.

9. The DV LED display device of claim 1, wherein the transparent film is translucent.

10. The DV LED display device of claim 1, wherein the polymer material layer is coated by one or more of a hard coating, an antimicrobial layer, and a fingerprint-resistant oleophobic coating.

11. The DV LED display device of claim 1, wherein the adhesive layer is a pressure sensitive adhesive that optically couples to the LEDs.

12. The DV LED display device of claim 1, wherein the transparent film further includes a neutral density filter.

13. The DV LED display device of claim 1, wherein the transparent film is absorbent of wavelengths of light in the visible spectrum that are not emitted by the LEDs.

14. The DV LED display device of claim 1, wherein the transparent film is removable without damaging the DV LED display or leaving an adhesive residue on the DV LED display.

15. A method of preparing a direct view light emitting diode (DV LED) display for touch screen use, the DV LED display including one or more DV LED modules each having a substrate on which an array of LEDs are mounted, the method comprising:
   providing a flexible adhesive-backed transparent film, including a polymer material layer and an adhesive layer laminated to the polymer material layer; and
   applying the transparent film to the DV LED display so that the adhesive layer adheres directly to at least one DV LED module, wherein the adhesive layer has a bond strength to the LEDs that is less than a bond strength between the LEDs and the substrate, and less than a bond strength between the adhesive layer and the polymer material layer.

16. The method of claim 15, wherein the transparent film is provided in the form of a roll.

17. The method of claim 15, further comprising peeling the transparent film away from the DV LED display without damaging the DV LED display.

18. A direct view light emitting diode (DV LED) display device comprising:
   an array of multiple DV LED modules defining a display surface, each DV LED module including a substrate having an array of multiple discrete LEDs mounted on a surface of the substrate; and
   a transparent film covering multiple DV LED modules of the display surface, the transparent film having an external surface and including:
      a polymer material layer having a thickness between 0.010 inch and 0.100 inch, and
      an adhesive layer laminated to the polymer material layer and adhered to the LEDs of the DV LED modules covered by the transparent film, with the external surface of the transparent film facing away from the array of LEDs, the adhesive layer optically coupling the polymer material layer to the LEDs of the DV LED modules covered by the transparent film, the adhesive having sufficiently low adhesion to the LEDs such that the transparent film can be removed from the DV LED without damaging the DV LED display.

19. The DV LED display device of claim 18, wherein:
   the substrate of each DV LED module includes a circuit board on which the array of LEDs is mounted; and
   the array of LEDs is an array of surface mount device (SMD) LEDs.

20. The DV LED display device of claim 18, wherein the transparent film further includes one or more of an anti-reflective layer, a neutral density filter, an oleophobic coating, and an antimicrobial coating.

21. The DV LED display device of claim 18, wherein the adhesive layer includes a pressure-sensitive acrylic adhesive.

* * * * *